United States Patent
Laaksonen et al.

(10) Patent No.: US 6,762,130 B2
(45) Date of Patent: Jul. 13, 2004

(54) METHOD OF PHOTOLITHOGRAPHICALLY FORMING EXTREMELY NARROW TRANSISTOR GATE ELEMENTS

(75) Inventors: Reima Tapani Laaksonen, Dallas, TX (US); Jarvis B. Jacobs, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/160,197

(22) Filed: May 31, 2002

(65) Prior Publication Data

US 2003/0224606 A1 Dec. 4, 2003

(51) Int. Cl.[7] ............................................. H01L 21/302
(52) U.S. Cl. ........................ 438/706; 438/708; 438/709; 438/717; 438/719; 438/724; 438/725
(58) Field of Search ................................ 438/706, 708, 438/709, 717, 719, 724, 725

(56) References Cited

U.S. PATENT DOCUMENTS

| | | | |
|---|---|---|---|
| 6,010,829 A | * | 1/2000 | Rogers et al. .............. 430/316 |
| 6,103,559 A | * | 8/2000 | Gardner et al. ............. 438/183 |
| 6,107,172 A | * | 8/2000 | Yang et al. .................. 438/585 |
| 6,121,123 A | * | 9/2000 | Lyons et al. ................ 438/585 |
| 6,362,111 B1 | | 3/2002 | Laaksonen et al. |
| 6,368,982 B1 | * | 4/2002 | Yu ............................. 438/753 |
| 6,514,871 B1 | * | 2/2003 | Yang et al. .................. 438/725 |
| 6,537,867 B1 | * | 3/2003 | Freyman et al. ............ 438/197 |

* cited by examiner

*Primary Examiner*—Nadine G. Norton
*Assistant Examiner*—Binh X. Tran
(74) *Attorney, Agent, or Firm*—Yingsheng Tung; Wade James Brady, III; Frederick J. Telecky, Jr.

(57) ABSTRACT

A method of forming a narrow feature, such as a gate electrode (14) in an integrated circuit is disclosed. A gate layer (14) such as polycrystalline silicon is disposed near a surface of a substrate (12), and a hardmask layer (16) is formed over the gate layer (14). The hardmask layer (16) includes one or more dielectric layers (16a, 16b, 16c) such as silicon-rich silicon nitride, silicon oxynitride, and oxide. Photoresist (18) sensitive to 193 nm UV light is patterned over the hardmask layer (16) to define a feature of a first width (CD) that is reliably patterned at that wavelength. The hardmask layer (16) is then etched to clear from the surface of the gate layer (14). A timed overetch of the hardmask layer (16) reduces hardmask CD and that of the overlying photoresist (18) to the desired feature size. Etch of the gate layer is then carried out to form the desired feature.

15 Claims, 2 Drawing Sheets

METHOD OF PHOTOLITHOGRAPHICALLY FORMING EXTREMELY NARROW TRANSISTOR GATE ELEMENTS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit manufacturing, and is more specifically directed to the fabrication of transistor gate elements.

A fundamental goal in the integrated circuit art is to form ever-smaller active and passive devices in the circuit. As the dimensions of transistors and other devices decrease, the chip area required to fabricate an integrated circuit of a given level of functionality decreases approximately as the square of the decrease in the critical dimension. Smaller chip area reduces the cost of manufacture for each circuit, or conversely increases the functionality that can be provided by a single integrated circuit of a given size. In addition, the performance of the integrated circuit also tends to increase as the active devices are made smaller.

For metal-oxide-semiconductor (MOS) integrated circuits, a fundamental dimension is the physical width of the transistor gate, which is also often referred to as the gate length. This gate length translates to the length of the conduction channel, from source to drain, of the MOS transistor. Because the transconductance (gain) of the MOS transistor varies inversely with channel length for a given channel width, it is desirable to form MOS transistor gates with ever-decreasing channel lengths. In addition, the smaller gate length devices reduces the integrated circuit chip area, theoretically reducing manufacturing cost while increasing circuit density and functionality. Because of this far-reaching importance, the physical width of the gate electrode (i.e., the "gate length", sometimes also referred as the "gate width") of the smallest MOS transistors in the integrated circuit is also often referred to as the critical dimension ("CD").

Recent improvements in integrated circuit manufacturing technology has resulted in the formation of extremely small transistors, for example with MOS transistor gates now less than 100 nm in length. As is also fundamental in the art, these transistor gates are commonly formed of polycrystalline silicon (polysilicon), sometimes clad with a higher conductivity material such as a refractory metal silicide. The size and locations of transistor gates are defined by photolithography and masked etching of the polysilicon material. However, there is demand for transistors with gate lengths smaller than can be printed with present day lithography, even using phase-shift reticles.

A known technique for defining transistor gates at lengths less than the wavelength of the photolithographic energy involves the "trimming" of patterned photoresist. FIGS. 1a through 1f illustrate this conventional approach, by way of an example of a device formed at the surface of substrate 2. Typically, substrate 2 will include doped regions, such as wells and perhaps also epitaxial layers. As typical for MOS transistors, gate dielectric layer 3, generally formed of thermal silicon dioxide alone or in combination with silicon nitride, is present between substrate 2 and gate layer 4. Gate layer 4 is typically formed of polysilicon, but alternatively may be formed of a stack of polysilicon with a refractory metal such as tungsten, or may be a layer of refractory metal. Hardmask layer 6 overlies gate layer 4 in this conventional example. Hardmask layer 6 may be formed of silicon dioxide, silicon nitride, silicon oxynitride, or a stack of these materials. In addition, hardmask layer 6 serves also as an anti-reflective layer.

Photoresist layer 8 overlies hardmask layer 6 in this conventional example. In conventional processes, photoresist layer 8 is sensitive to ultraviolet light, for example at a wavelength of 248 nm. Photoresist layer 8 may be either of the positive or negative type; in the case of positive photoresist, the portions exposed to light remain as a mask after developing, while the portions of negative photoresist that are exposed to light are removed after developing. In either case, FIG. 1b illustrates the result of photolithographic exposure of selected portions of photoresist layer 8, through a mask or reticle, following which only selected portions of photoresist layer 8 remain. In the case of FIG. 1b, the remaining portion of photoresist layer 8 has a width $w_p$, as defined by the overlying mask or reticle in the conventional manner. This width $w_p$, which as noted above is also called the critical dimension (CD) value, is wider than the desired eventual gate length, however.

FIG. 1c illustrates the "trimming" of photoresist layer 8 after its patterning to a CD value $w_p$. The structure is exposed to a chemistry, for example a dry or plasma etch including oxygen as a reactive species, which in effect isotropically etches photoresist layer 8, removing it from its sides and top. This etch is generally a timed etch, with the duration depending upon the desired CD reduction and on the etch rate of photoresist layer 8. Following this trimming etch, photoresist layer 8 has a CD value of $w_R$, on the average, as shown in FIG. 1c. This CD value $w_R$ is then the desired gate length to which gate layer 4 is to be etched, and may be on the order of 100 nm or less in modern processes.

Hardmask layer 6 is then etched, using trimmed photoresist layer 8 as a mask, resulting in the structure shown in FIG. 1d. This hardmask etch also tends to remove photoresist 8 to some extent, requiring that the trimmed photoresist layer 8 must be of sufficient thickness to successfully transfer its pattern to hardmask layer 6. Following hardmask etch, the remaining portion of photoresist layer 8 is ashed to remove any source of contaminants for the following processes. Gate layer 4 is etched using the patterned hardmask layer 6 as a mask, resulting in the structure shown in FIG. 1e. Hardmask layer 6 is then removed, leaving gate layer 4 at the desired feature length $w_R$, as shown in FIG. 1f.

This conventional process has been observed to work reasonably well with conventional 248 nm photoresist, because this class of photoresist is quite stable. However, as noted above, it is desirable to form ever-shrinking gate electrodes, and as such shorter wavelength photolithography is desirable, requiring photoresist that is sensitive to even shorter wavelength UV light.

One class of photoresist that has recently been developed is photoresist that is sensitive to 193 nm UV light. Examples of this photoresist include PAR-707 and PAR-710 available from Sumitomo and AR237 available from JSR. Currently, the 193 nm resists are still immature, in the sense that printed lines are often rough and that these resists are not very stable. It has also been observed that 193 nm photoresist lines shrink when they are measured by top-down scanning electron microscopy (SEM). More importantly, the photoresists are not very resistant to the etch process, as the lines patterned from these photoresists shrink very fast during the etch process. The instability of 193 nm photoresist affects its masking performance. The conventional trimming of 193 nm photoresist, as shown in FIG. 1c, has been observed to result in a photoresist feature that is not thick enough to suitably transfer the pattern to the underlying hardmask or ARC. If the 193 nm photoresist is applied in a thicker layer to address this problem, however, its excessive height cannot be supported at sub-100 nm widths; falling of excessively thick 193 nm photoresist lines has been observed. Excessive photoresist height is also incompatible with the very shallow depth of focus now present in modern deep UV photolithography.

By way of further background, the use of halogen-bearing etch chemistry to etch hardmask materials such as oxides and nitrides, with features masked by 248 nm photoresist elements, is known.

BRIEF SUMMARY OF THE INVENTION

It is therefore an object of this invention to provide a process in which features having critical dimensions that can be smaller than the wavelength of the photolithographic exposure light.

It is a further object of this invention to provide such a process that is suitable for use with 193 nm photoresist.

It is a further object of this invention to provide such a process that can be readily controlled in practice.

It is a further object of this invention to provide such a process that is compatible with conventional process chemistries.

It is a further object of this invention to provide such a process that minimizes the thickness of photoresist required for definition of a hardmask layer.

Other objects and advantages of the present invention will be apparent to those of ordinary skill in the art having reference to the following specification together with its drawings.

The present invention may be implemented in a photolithographic process for forming a critical dimension feature, such as the gate electrode for a metal-oxide-semiconductor (MOS) transistor. A photoresist feature is patterned, for example using photoresist material sensitive to 193 nm light and by exposing this photoresist to 193 nm light through a mask or reticle. The photoresist is overlying a hardmask material, comprised of one or more of an inorganic layers, including one or more layers of silicon dioxide, silicon oxynitride, silicon rich-nitride, and silicon nitride. The photolithographic patterning of the photoresist defines a feature that is wider than the desired eventual width, or critical dimension (CD) value, of the feature. Hardmask etch is then carried out, to define a hardmask feature at this wider CD value. An overetch of the hardmask feature and of the photoresist feature is then performed, to "trim" the hardmask feature and the photoresist to the desired critical dimension value. The photoresist is then removed, and the remaining hardmask used in the etch of the underlying gate layer material, to define a critical dimension feature in that material.

DETAILED DESCRIPTION OF THE INVENTION

This invention will now be described in detail relative to its preferred embodiment, which is in connection with the forming of a polysilicon gate electrode for a metal-oxide-semiconductor (MOS) transistor. This specific application of a polysilicon gate MOS device is selected because this invention is especially beneficial when applied to this structure. As known in the art, the MOS gate length is often the critical dimension in many integrated circuit devices, and in large part determines the overall chip area that will be occupied by the integrated circuit. This invention is especially beneficial in this application, because of its benefits in forming this minimum feature size. However, it is contemplated that this invention may also and alternatively be used in connection with other semiconductor devices and device features, including integrated circuits in technologies other than MOS such as bipolar, gate electrodes formed of materials other than polysilicon, and other alternative embodiments. It is contemplated that these and other alternative embodiments are within the scope of this invention as claimed.

Figure 1A:
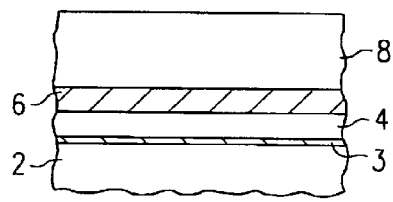
FIGS. 1a through 1f are cross-sectional diagrams illustrating the formation of a gate electrode according to a conventional process.
Figure 1B:
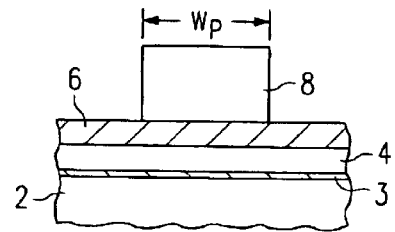
Figure 1C:
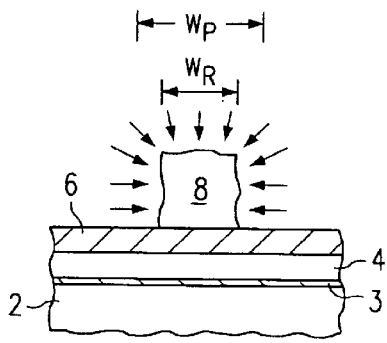
Figure 1D:
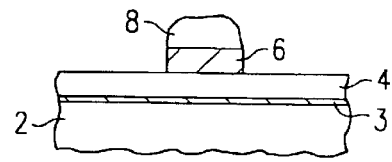
Figure 1E:
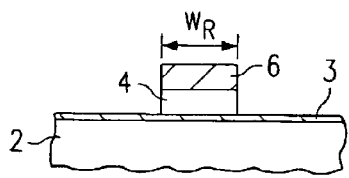
Figure 1F:
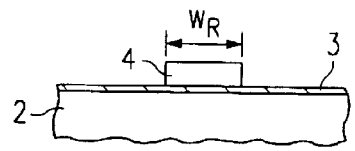
Figure 2A:
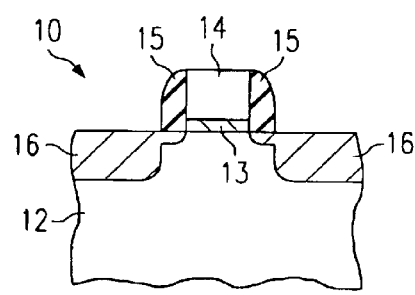
FIGS. 2a and 2b are cross-sectional and plan views, respectively, illustrating a gate electrode as formed according to the preferred embodiment of the invention.
Figure 2B:
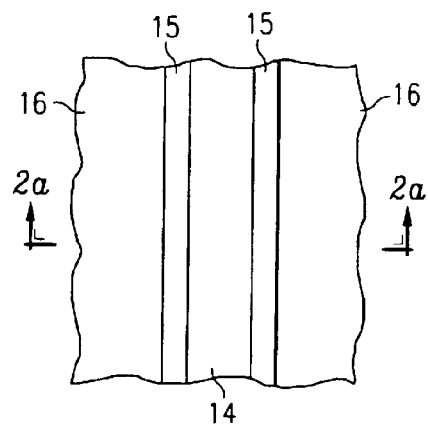

FIGS. 2a and 2b illustrate transistor 10 according to this preferred embodiment of the invention, in cross-section and plan view, respectively. In this example of the invention, transistor 10 is a metal-oxide-semiconductor (MOS) transistor of the lightly-doped drain (LDD) type. Transistor 10 is formed at a surface of substrate 12. Substrate 12 may be a conventional bulk silicon substrate of the appropriate conductivity type and doping for the formation of transistor 10, and may include an epitaxial layer at its surface to provide the appropriate active region. In addition, doped wells may be formed at the surface of substrate 12, as usual for complementary MOS (CMOS) circuits. Further in the alternative, substrate 12 may correspond to the semiconductor layer in a silicon-on-insulator (SOI) wafer, or still further in the alternative may be formed of a semiconductor material other than silicon.

In transistor 10 according to the preferred embodiment of the invention, gate electrode 14 is formed of polysilicon, and overlies gate dielectric layer 13 at the surface of substrate 12. As known in the art, gate electrode 14 may be clad with a metal silicide, may be constructed as a stack of polysilicon and a refractory metal, or may instead be formed of a refractory metal such as tungsten. Source/drain regions 16 are diffused doped portions formed in substrate 12, and are preferably formed after the formation of gate electrode 14 so as to be self-aligned relative to gate electrode 14. In this embodiment of the invention, insulator filaments 15 are formed on the sides of gate electrode 14, and are used as spacers in forming LDD source/drain regions 16. As known in the art for this type of transistor, lightly-doped extensions of source and drain regions 16 are formed by a light dose ion implantation self-aligned with gate electrode 14 itself, and heavier source/drain implant are self-aligned to sidewall filaments 15 to complete the formation of source/drain regions 16. Of course, transistor 10 may be alternatively formed without the lightly-doped extensions, or according to another technique for example as used in the drain-extended MOS transistor.

As evident from FIGS. 2*a* and 2*b*, the width of gate electrode 14 thus defines the channel length under gate dielectric 13 between source/drain regions 16. As is fundamental in the art, the transconductance of transistor 10 depends upon the ratio of the channel width to this channel length. Accordingly, a shorter channel length will generally provide higher gain for a given channel width, assuming that the channel is not so short that the device is leaky or breaks down at an unduly low voltage. Alternatively, a shorter channel length permits a transistor of a given transconductance to be formed in a smaller area, if channel width is also decreased accordingly. It is therefore desirable to form MOS transistors with ever-smaller transistor gate lengths, and thus ever-smaller channel lengths. Recently, devices with gate lengths as small as 100 nm and less have been fabricated, using conventional technologies.

Figure 3A:
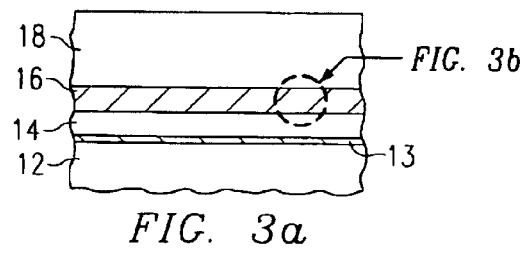
FIGS. 3a through 3f are cross-sectional diagrams illustrating a method of forming a gate electrode according to the preferred embodiment of the invention.
Figure 3B:
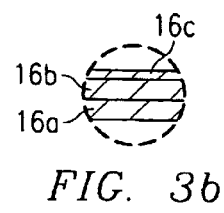

Referring now to FIGS. 3*a* through 3*f*, a method of forming gate electrode 14 according to the preferred embodiment of the invention will now be described in detail. FIGS. 3*a* through 3*f* are cross-sectional views illustrating the formation of transistor 10 at various stages in its fabrication, taken along the same view as that of FIG. 2*a*. As shown in FIG. 3*a*, gate dielectric layer 13 is disposed at a surface of substrate 12, preferably formed by the thermal oxidation of silicon at that surface of substrate 12, by the deposition of silicon nitride, or by other known techniques for the particular composition of gate dielectric 13. Gate layer 14 is deposited over gate dielectric 13. According to this preferred embodiment of the invention, gate layer 14 is formed of polycrystalline silicon, in which case the deposition is preferably carried out by chemical vapor deposition. Alternatively, other materials may be used for gate layer 14, deposited by the appropriate method for such materials.

As shown in FIG. 3*a*, according to this preferred embodiment of the invention, hardmask layer 16 is disposed over gate layer 14 at this stage in the process. In an exemplary embodiment of the invention, shown in the expanded view of FIG. 3*b*, hardmask layer 16 is formed in three layers, beginning with silicon-rich nitride (SRN) layer 16*a* disposed adjacent to gate layer 14. As known in the art, silicon-rich nitride layer 16*a* is chemically silicon nitride, but with a concentration of silicon that is higher than stoichiometric silicon nitride ($Si_3N_4$). Silicon oxynitride (SiON) layer 16*b*, which is a mixture of silicon, oxygen, and nitrogen, is then disposed on silicon-rich nitride layer 16*a*. Silicon oxynitride layer 16*b*, is preferably formed by chemical vapor deposition chamber of a suitable combination of gases, e.g., silane ($SiH_4$) and $N_2O$. Occasionally, wafers must be re-worked at lithography before they can be etched; the resist must be removed from the wafers, and the wafers must be re-patterned. Because of this rework it may be advantageous to deposit a thin oxide layer 16*c* on top of the SiON layer 16*b*. SRN layer 16*a*, SiON layer 16*b*, and oxide layer 16*c* work both as a hardmask, and also as an anti-reflective coating to reduce reflections during photolithography. Alternatively, hardmask layer 16 may consist of a single layer, if desired, depending upon the particular application.

At the point in the process illustrated in FIG. 3*a*, photoresist layer 18 is also in place over hardmask layer 16. According to this preferred embodiment of the invention, the photoresist of layer 18 is sensitive to light at wavelengths at and near 193 nm. This extremely deep UV sensitive photoresist is useful in patterning extremely narrow features, as known in the art. An example of a 193 nm photoresist suitable for use as photoresist layer 18 according to this preferred embodiment of the invention is PAR-707 available from Sumitomo. Following the formation of the structure shown in FIG. 3*a*, photoresist layer 18 is photolithographically exposed in the conventional manner through a mask or reticle having the appropriate pattern to form gate electrode 14 in transistor 10. The wavelength of the UV light of this exposure of course matches the 193 nm sensitivity of photoresist layer 18.

Figure 3C:
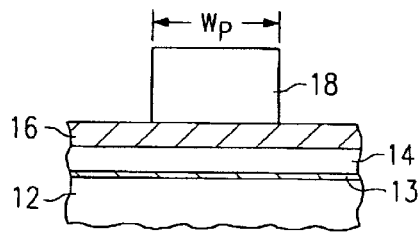

Following exposure of the entire wafer into which transistor 10 is realized, the exposed photoresist is developed to remove the undesired portions of photoresist layer 18, from the locations of gate layer 14 that are to be etched. The resulting structure includes photoresist portions 18 at those locations of hardmask layer 16 and gate layer 14 that are to be protected from the ensuing etches. FIG. 3*c* illustrates the result of the photolithographic exposure and developing of photoresist layer 18 according to this embodiment of the invention. As shown in FIG. 3*c*, remaining photoresist 18 is a feature with a width, or critical dimension (CD) value, $w_p$. The term "CD value" will be used in this description to refer to this measurement of this and other similar features related to the length of eventual gate electrode 14 in the direction between the transistor source and drain, to avoid confusion that can occur from references to the terms "gate width", "gate length", or "channel length". In this embodiment of the invention, feature CD value $w_p$ is significantly larger than the length of eventual gate electrode 14, and preferably is a CD value that can be reliably patterned with 193 nm wavelength light by using a binary mask, such as on the order of from 110 to 130 nm. As known in the art, feature CD value $w_p$ may actually be less than the light wavelength, through the use of phase shift masking and other techniques, but is still substantially larger than the eventual gate length (CD).

Figure 3D:
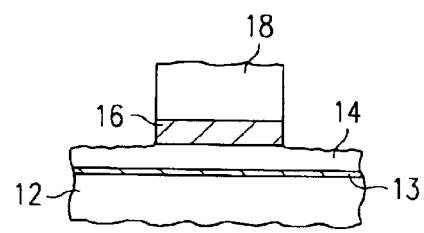

After the photolithographic patterning of photoresist layer 18, the structure is etched to remove hardmask layer 16 at locations other than from underlying remaining photoresist 18. This etch is carried out using the feature CD value $w_p$ to which photoresist 18 was patterned; according to this embodiment of the invention, no line CD reduction, or "trimming", is performed on photoresist 18 prior to the hardmask etch. The etch of hardmask layer 16 is preferably a plasma etch (also referred to as a "dry" etch), where the active etchant species includes both a plasma-activated carbon-bearing halogen, and oxygen. An example of the plasma etch of hardmask layer 16 is a plasma etch with $CF_4$ and $O_2$ as the etchant species, carried out at an extremely low pressure (on the order of 4 mTorr), at a bias of 50 W and a source power of 500 W; preferably, the flow of $CF_4$ is about 75 sccm, and the $O_2$ flow is about 5 sccm. This etch is carried out until the hardmask layer 16 has been removed. Preferably, the duration of this etch is controlled by a conventional endpoint detection technique, examples of which include optical emission monitoring, laser interferometry, plasma gas composition monitoring, or wafer impedance monitoring. The resulting structure is shown in FIG. 3*d*. As evident from this Figure, this hardmask etch also removes a portion of photoresist layer 18 from the top, due to the presence of the oxygen etch species and the impact of energetic ions present in the plasma. It is also evident from FIG. 3*d* that the hardmask etch slightly etches polysilicon layer 14.

Figure 3E:
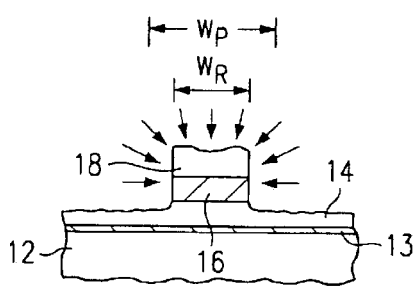

Following the endpoint etch of hardmask layer 16 from the surface of polysilicon gate layer 14, according to this embodiment of the invention, the stack of hardmask layer 16 and remaining photoresist feature 18 is then subjected to a line CD reduction. This trimming can be performed by overetching hardmask layer 16 under the same or slightly different conditions and chemistry used to remove hardmask layer 16 from gate layer 14 at the unmasked locations, with the overetch continuing for a specific time duration selected to accomplish the desired line CD reduction. It has been discovered, in connection with this invention, that the overetch of hardmask layer 16 reduces the hardmask by an amount that substantially matches the amount by which overlying photoresist 18 is reduced by the overetch. In other words, the feature CD is reduced at substantially the same rate for both photoresist 18 and the feature of underlying hardmask layer 16. The presence of photoresist 18 on the top surface of the feature of hardmask layer 16 masks this overetch from reducing the thickness of hardmask layer 16, maintaining hardmask layer 16 at its deposited thickness so that it can properly mask photoresist layer 14. FIG. 3e illustrates the result of this overetch, providing feature CD value $w_R$ of hardmask layer 16 and remaining photoresist 18, which is substantially less than the patterned feature CD value $w_p$. The exposed surfaces of polysilicon layer 14 are somewhat further etched during this overetch.

The feature CD reduction can be achieved also by an alternative method. In this alternative method, the over etch step time is constant, but the amount of oxygen in the over etch step is varied to achieve the desired feature CD value $w_R$.

According to the preferred embodiment of the invention, it is contemplated that feature CD value $w_R$ will be less than 100 nm, for example on the order of 90 nm according to current technology. While not evident in the cross-sectional view of FIG. 3e, it has been observed that the feature of hardmask layer 16 and photoresist 18 at this stage in the process, after the line CD reduction during the hardmask overetch, is very uniform, with much less edge roughness than that achieved in conventional methods. This good definition of the gate feature accomplished by this invention permits precise sizing of eventual transistor 10, and permits improved device performance because the narrow gate feature can be formed with improved tolerance and confidence because of this edge smoothness.

Figure 4:
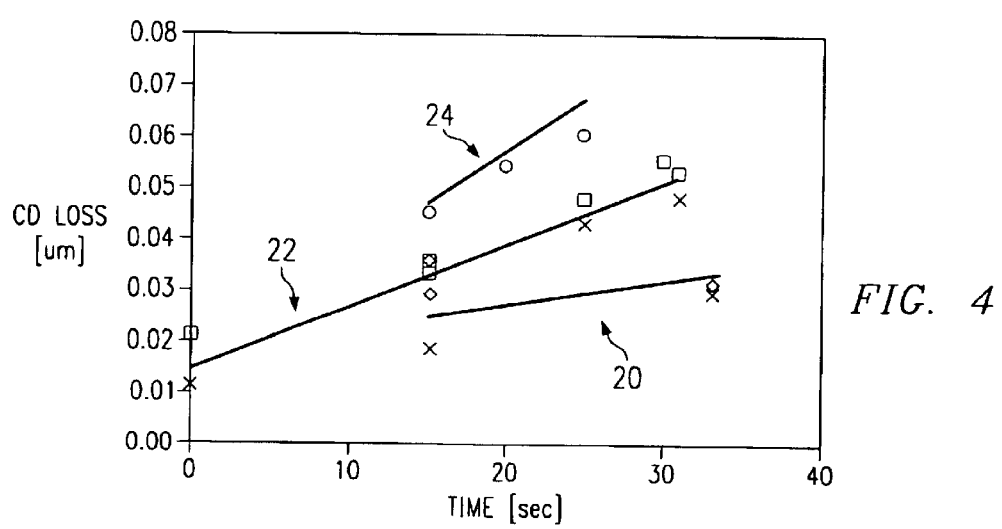
FIG. 4 is a plot of hardmask over etch time versus critical dimension reduction at various oxygen concentrations, according to the preferred embodiment of the invention.

The extent of the overetch (the difference between patterned feature CD value $w_p$ and reduced feature CD value $w_R$) depends upon the etch chemistry and the time duration of the overetch. It is believed that oxygen is the active species that reduces the CD of photoresist 18, while the $CF_4$ or other active halogen reduces the CD of hardmask layer 16. FIG. 4 illustrates the effects of time and oxygen concentration upon the line width reduction achieved according to the preferred embodiment of the invention, with all other variables being equal. In FIG. 4, line CD reduction is referred to as "CD loss", for "critical dimension loss", and refers to the difference between patterned feature width $w_p$ and reduced feature width $w_R$ (i.e., including both sides of the feature). Plot 20 illustrates the line CD reduction if no oxygen is included in the overetch chemistry. As evident from FIG. 4, with no oxygen present only a slight line CD reduction is accomplished, even at relatively long times. Plot 22 illustrates the line CD reduction versus overetch time with oxygen at a flow of 5 sccm, and plot 24 illustrates the line CD reduction versus overetch time at an oxygen flow of 8 sccm. It has also been discovered, according to this invention, that the line CD reduction tends to saturate as oxygen flow rate is increased much above the 8 sccm of plot 24. In the example of FIG. 4, it is contemplated that the oxygen flow of 5 sccm is preferred, as reasonable line CD reduction is attained in relatively short times, while yet providing a good degree of controllability of the overetch.

In addition, it is believed that the active species tend to interact with one another in controlling the line CD reduction of photoresist 18. Specifically, it has been observed in connection with this invention that if the active species of $CF_4$ is replaced with $CHF_3$, the rate of line CD reduction is slowed even further. Alternatively, if pure $O_2$ is used (diluted with helium for improved control), the rate of line width reduction is maximized. From these results, it is contemplated that the carbon in the active species of $CF_4$ and $CHF_3$ may form a polymer along the sides of photoresist 18 and hardmask layer 16, which slows the line CD reduction to a controllable rate; however, other physical mechanisms by way of which the active species interact may instead or also be controlling the line CD reduction.

The overetch of hardmask layer 16 according to the preferred embodiment of the invention not only reduces the CD of overlying photoresist layer 18, but likely also reduces the thickness of photoresist 18, to the extent that photoresist 18 may be almost completely removed from above hardmask layer 16. It is preferred, however, that at least some photoresist 18 remain in place at the top surface of hardmask layer 16 during the overetch, so that the thickness of hardmask layer 16 is not reduced by the overetch. In this way, hardmask layer 16 remains at its full thickness to provide excellent masking of the underlying polysilicon gate layer 14 during its etch, as will now be described. To the extent that any photoresist 18 remains in place, an oxygen ash is performed after the hardmask overetch, to volatilize and remove this material.

Alternatively, it is contemplated that hardmask layer 16 may be made thin enough so that it does not necessarily function as a hardmask, but only as an antireflective coating. In this case, a sufficient thickness of photoresist 18 should remain in place, after the overetch of "hardmask" layer 16, to function as a mask during the etch of polysilicon gate layer 14.

Polysilicon gate layer 14 is then etched, using hardmask layer 16 as a mask. This etch is preferably a plasma etch using conventional polysilicon etch chemistries. An example of the polysilicon etch is a multiple-step etch sequence:

| Step | 1 | 2 | 3 | 4 |
|---|---|---|---|---|
| time (sec) | 5 | 15 | endpoint | 45 |
| pressure (mTorr) | 4 | 4 | 20 | 100 |
| Bias (W) | 40 | 80 | 60 | 150 |
| Source (W) | 500 | 800 | 400 | 1000 |
| $CF_4$ (sccm) | 50 | 20 | — | — |
| HBr (sccm) | — | 90 | 160 | 160 |
| $Cl_2$ (sccm) | — | 55 | 20 | — |
| $He:O_2$ (sccm) | — | 15 | 24 | 10 |

The first step in this sequence may not be necessary; it may be included, however, to make sure that any oxide that might have been formed during the ash step is removed before the actual poly etch steps. The second and the third steps are the primary polysilicon etch steps, while the fourth step is an overetch step to clear any polysilicon filaments and similar unwanted artifacts.

Of course, if gate layer 14 is formed of other materials, including refractory metals or their silicides, the etch process will be modified accordingly.

Figure 3F:
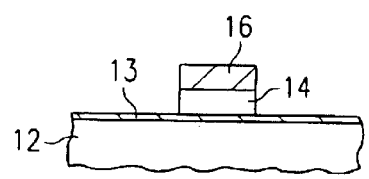

The result of this gate layer etch is illustrated in FIG. 3f. Gate layer 14 is cleared from the surface of gate dielectric 13, but remains in the desired location underlying the remaining portion of hardmask layer 16. The CD of remaining gate layer 14 at this stage is defined by the CD of hardmask layer 16, along with the extent of any overetch of gate layer 14. According to this embodiment of the invention, and as noted above, it is contemplated that this feature CD will be less than 100 nm, for example on the order of 90 nm using current technology. This gate length is smaller than can be reliably patterned directly by 193 nm photolithography.

Referring back to FIGS. 2a and 2b, the remaining process steps in the formation of transistor 10 are now performed, including the formation of LDD source/drain regions 16, subsequent silicidation of the source, drain, and gate if desired, and the like. This remaining processing can be carried out in the conventional manner for extremely short-channel devices such as transistor 10.

According to this invention, important benefits in the formation of narrow device features are attained. A method of forming device features that can be smaller than the wavelength of the light used in the photolithographic definition of the patterned feature is provided, in which the uniformity of the feature CD is greatly improved over conventional techniques. The instability of the very deep UV photoresist (~193 nm) is overcome according to this invention, by performing line CD reduction after the underlying mask layer has been etched with the photolithographically patterned photoresist as its mask. In addition, this invention allows for precise control of the line CD reduction of the hardmask and photoresist, by adjustment of the overetch step time or the overetch step chemistry. These benefits are thus achieved without requiring an excessively thick layer of photoresist.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of forming a conductive feature in an integrated circuit, comprising:

forming a conductive layer near a surface of a substrate;

forming an antireflective inorganic layer, which includes a antireflective layer of silicon-rich nitride underlying a layer of silicon oxynitride over the layer of conductive material;

forming a photoresist layer over the antireflective inorganic layer;

photolithographically patterning the photoresist layer with light of a selected wavelength, to define a photoresist feature having a first CD value;

etching the antireflective inorganic layer using the photoresist feature as a mask to remove the antireflective inorganic layer from the surface of the conductive layer at locations away from the photoresist feature, defining an antireflective inorganic layer feature having a CD value corresponding to the first CD value, the antireflective inorganic layer feature underlying the photoresist feature;

over-etching the antireflective inorganic layer feature to reduce its CD value to a second CD value smaller than the first CD value, the over-etching also reducing the CD value of the photoresist feature;

then etching the conductive layer using the antireflective inorganic layer feature and any remaining portion of the photoresist feature as a mask.

2. The method of claim 1, wherein the conductive layer comprises polycrystalline silicon.

3. The method of claim 1 wherein the selected wavelength is about 193 nm or less.

4. The method of claim 1, wherein the second CD value is less than 100 nm.

5. The method of claim 1, wherein the photoresist feature is substantially completely removed by the over-etching step, so that the antireflective inorganic layer feature serves as a hardmask in the step of etching the conductive layer.

6. The method of claim 1, wherein the first CD value is smaller than the selected wavelength.

7. The method of claim 6, wherein the selected wavelength is about 193 nm or less.

8. The method of claim 1, wherein the over-etching step comprises plasma etching the antireflective inorganic layer with a mixture of reactive gases including oxygen and a carbon-containing halogen compound.

9. The method of claim 8, wherein the carbon-containing halogen compound is $CF_4$.

10. The method of claim 8, wherein the step of etching the antireflective inorganic layer comprises plasma etching the reflective inorganic layer in the presence of a mixture of gases comprising oxygen and helium.

11. The method of claim 8, wherein the etching step comprises plasma etching the antireflective inorganic layer with a mixture of reactive gases including oxygen and a carbon-containing halogen compound.

12. The method of claim 11, wherein the carbon-containing halogen compound is $CHF_3$.

13. The method of claim 1, wherein the carbon-containing halogen compound is a mixture of $CHF_3$ and $CF_4$.

14. The method of claim 11, wherein the step of etching the antireflective inorganic layer is continued until an etch endpoint is detected and wherein the over-etching step comprises continuing the plasma etching for a selected time.

15. The method of claim 14, further comprising controlling a flow of oxygen according to a desired rate of line CD reduction of the antireflective inorganic layer feature and the photoresist feature.

* * * * *